(12) United States Patent
Hsiung et al.

(10) Patent No.: US 11,965,702 B1
(45) Date of Patent: Apr. 23, 2024

(54) LOW PRESSURE DROP AUTOMOTIVE LIQUID-COOLING HEAT DISSIPATION PLATE AND ENCLOSED AUTOMOTIVE LIQUID-COOLING COOLER HAVING THE SAME

(71) Applicant: AMULAIRE THERMAL TECHNOLOGY, INC., New Taipei (TW)

(72) Inventors: Chun-Li Hsiung, New Taipei (TW); Kuo-Wei Lee, New Taipei (TW); Chien-Cheng Wu, New Taipei (TW); Chun-Lung Wu, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 0 days.

(21) Appl. No.: 17/970,728

(22) Filed: Oct. 21, 2022

(51) Int. Cl.
*F28F 3/04* (2006.01)
*F28D 1/03* (2006.01)
(Continued)

(52) U.S. Cl.
CPC ............ *F28F 3/048* (2013.01); *F28D 1/0316* (2013.01); *F28D 9/0043* (2013.01); *F28D 2021/0028* (2013.01); *H05K 7/20009* (2013.01)

(58) Field of Classification Search
CPC .......... F28F 2215/04; F28F 3/048; F28F 3/04; F28D 9/0043
See application file for complete search history.

(56) References Cited

U.S. PATENT DOCUMENTS 7,173,823 B1 * 2/2007 Rinehart ............... F28F 21/065
165/80.4
7,667,967 B1 * 2/2010 Copeland ........... H05K 7/20736
361/679.48

(Continued)

FOREIGN PATENT DOCUMENTS

CN 101950822 A * 1/2011
CN 102884877 B 9/2015
(Continued)

OTHER PUBLICATIONS

Translation of KR20140085011A entitled Translation—KR20140085011A (Year: 2023).*

(Continued)

*Primary Examiner* — Paul Alvare
(74) *Attorney, Agent, or Firm* — Li & Cai Intellectual Property (USA) Office

(57) ABSTRACT

A low pressure drop automotive liquid-cooling heat dissipation plate and an enclosed automotive liquid-cooling cooler having the same are provided. The low pressure drop automotive liquid-cooling heat dissipation plate includes a heat dissipation plate body and three fin sets. The heat dissipation plate body has a first heat dissipation surface and a second heat dissipation surface that are opposite to each other. The first heat dissipation surface is in contact with three traction inverter power component sets, and the second heat dissipation surface is in contact with a cooling fluid. Three heat dissipation regions that are spaced equidistantly apart from each other and that have a same size are defined on the second heat dissipation surface along a flow direction of the cooling fluid, and respectively correspond to three projection areas formed by projecting three traction inverter power component sets on the second heat dissipation surface.

5 Claims, 4 Drawing Sheets

(51) Int. Cl.
 *F28D 9/00* (2006.01)
 *H05K 7/20* (2006.01)
 *F28D 21/00* (2006.01)

(56) References Cited

U.S. PATENT DOCUMENTS

| | | | | |
|---|---|---|---|---|
| 11,335,964 | B2 * | 5/2022 | Fang | H01M 50/204 |
| 2006/0113661 | A1 * | 6/2006 | Yamabuchi | G05D 23/192 |
| | | | | 257/E23.098 |
| 2008/0030957 | A1 * | 2/2008 | Abul-Haj | H01L 23/467 |
| | | | | 257/E23.099 |
| 2009/0145581 | A1 * | 6/2009 | Hoffman | F28F 3/14 |
| | | | | 165/80.3 |
| 2009/0250195 | A1 * | 10/2009 | Yoshida | F28F 3/02 |
| | | | | 361/702 |
| 2010/0172091 | A1 * | 7/2010 | Nishiura | H01L 23/473 |
| | | | | 361/689 |
| 2011/0056669 | A1 * | 3/2011 | Pruett | B21D 53/02 |
| | | | | 165/122 |
| 2012/0012284 | A1 * | 1/2012 | Salamon | F28F 3/048 |
| | | | | 165/185 |
| 2013/0112373 | A1 * | 5/2013 | Fukai | H05K 7/2039 |
| | | | | 165/185 |
| 2013/0112388 | A1 * | 5/2013 | Kwak | H01L 23/473 |
| | | | | 165/185 |
| 2017/0363375 | A1 * | 12/2017 | Mayor | F28F 3/12 |
| 2019/0331428 | A1 * | 10/2019 | Arata | H01L 23/473 |
| 2020/0080796 | A1 * | 3/2020 | Dasgupta | F28F 7/02 |

FOREIGN PATENT DOCUMENTS

| | | | | |
|---|---|---|---|---|
| CN | 113784571 | A | * | 12/2021 |
| CN | 115621221 | A | * | 1/2023 |
| DE | 102015212721 | A1 | * | 1/2017 |
| JP | 6874823 | B1 | * | 5/2021 |
| JP | 2021196086 | A | * | 12/2021 |
| KR | 20140085011 | A | * | 6/2006 |
| TW | M616320 | U | | 9/2021 |
| WO | WO-2013118869 | A1 | * | 8/2013 ......... H01L 23/3677 |

OTHER PUBLICATIONS

Translation of JP2021196086A entitled Translation—JP2021196086A (Year: 2023).*

* cited by examiner

LOW PRESSURE DROP AUTOMOTIVE LIQUID-COOLING HEAT DISSIPATION PLATE AND ENCLOSED AUTOMOTIVE LIQUID-COOLING COOLER HAVING THE SAME

FIELD OF THE DISCLOSURE

The present disclosure relates to an automotive liquid-cooling heat dissipation plate and an automotive liquid-cooling cooler, and more particularly to a low pressure drop automotive liquid-cooling heat dissipation plate and an enclosed automotive liquid-cooling cooler having the same.

BACKGROUND OF THE DISCLOSURE

Coolers are widely used in various products. Generally, higher-end products adopt water-cooling or liquid-cooling coolers, which have advantages of quietness and a stable cooling performance compared to air-cooling coolers. However, as chips are operating on faster and faster clock speeds, a heat dissipation effect provided by existing liquid coolers are no longer fully capable of meeting heat dissipation requirements of these chips. Therefore, how heat can be more effectively dissipated via liquid-cooling technology has become an issue to be addressed in the relevant industry.

SUMMARY OF THE DISCLOSURE

In response to the above-referenced technical inadequacy, the present disclosure provides a low pressure drop automotive liquid-cooling heat dissipation plate and an enclosed automotive liquid-cooling cooler having the same.

In one aspect, the present disclosure provides a low pressure drop automotive liquid-cooling heat dissipation plate. The low pressure drop automotive liquid-cooling heat dissipation plate includes a heat dissipation plate body, a first fin set, a second fin set, and a third fin set. The heat dissipation plate body has a first heat dissipation surface and a second heat dissipation surface that are opposite to each other. The first heat dissipation surface is in contact with a first traction inverter power component set, a second traction inverter power component set, and a third traction inverter power component set. The first, second, and third traction inverter power component sets together form an inverter power module for generating a three-phase alternating current for driving an automotive motor. The second heat dissipation surface is in contact with a cooling fluid. The first fin set is located in a first heat dissipation region. The first heat dissipation region is defined by a first projection area formed by projecting the first traction inverter power component set on the second heat dissipation surface. The second fin set is located in a second heat dissipation region. The second heat dissipation region is defined by a second projection area formed by projecting the second traction inverter power component set on the second heat dissipation surface. The third fin set is located in a third heat dissipation region. The third heat dissipation region is defined by a third projection area formed by projecting the third traction inverter power component set on the second heat dissipation surface. A surface area formed by the first fin set located in the first heat dissipation region and in contact with the cooling fluid is less than a surface area formed by the second fin set located in the second heat dissipation region and in contact with the cooling fluid, and the surface area formed by the first fin set located in the first heat dissipation region and in contact with the cooling fluid is less than a surface area formed by the third fin set located in the third heat dissipation region and in contact with the cooling fluid. A contour of each of fins of the first fin set is drop-shaped, and a contour of each of fins of the second fin set and the third fin set is round-shaped. Any two adjacent ones of the first, second, and third heat dissipation regions have a low density heat dissipation region formed therebetween, a low density fin set is formed on the second heat dissipation surface and located in the low density heat dissipation region, and a surface area formed by the low density fin set located in the low density heat dissipation region and in contact with the cooling fluid is less than 50% of the surface area formed by the first fin set located in the first heat dissipation region and in contact with the cooling fluid.

In another aspect, the present disclosure provides an enclosed automotive liquid-cooling cooler. The enclosed automotive liquid-cooling cooler includes a low pressure drop automotive liquid-cooling heat dissipation plate and a heat dissipation base. The low pressure drop automotive liquid-cooling heat dissipation plate includes a heat dissipation plate body, a first fin set, a second fin set, and a third fin set. The heat dissipation plate body has a first heat dissipation surface and a second heat dissipation surface that are opposite to each other. The first heat dissipation surface is in contact with a first traction inverter power component set, a second traction inverter power component set, and a third traction inverter power component set. The first, second, and third traction inverter power component sets together form an inverter power module for generating a three-phase alternating current for driving an automotive motor. The second heat dissipation surface is in contact with a cooling fluid. The first fin set is located in a first heat dissipation region. The first heat dissipation region is defined by a first projection area formed by projecting the first traction inverter power component set on the second heat dissipation surface. The second fin set is located in a second heat dissipation region. The second heat dissipation region is defined by a second projection area formed by projecting the second traction inverter power component set on the second heat dissipation surface. The third fin set is located in a third heat dissipation region. The third heat dissipation region is defined by a third projection area formed by projecting the third traction inverter power component set on the second heat dissipation surface. A surface area formed by the first fin set located in the first heat dissipation region and in contact with the cooling fluid is less than a surface area formed by the second fin set located in the second heat dissipation region and in contact with the cooling fluid, and the surface area formed by the first fin set located in the first heat dissipation region and in contact with the cooling fluid is less than a surface area formed by the third fin set located in the third heat dissipation region and in contact with the cooling fluid. A contour of each of fins of the first fin set is drop-shaped, and a contour of each of fins of the second fin set and the third fin set is round-shaped. Any two adjacent ones of the first, second, and third heat dissipation regions have a low density heat dissipation region formed therebetween, a low density fin set is formed on the second heat dissipation surface and located in the low density heat dissipation region, and a surface area formed by the low density fin set located in the low density heat dissipation region and in contact with the cooling fluid is less than 50% of the surface area formed by the first fin set located in the first heat dissipation region and in contact with the cooling fluid. A groove is recessed from the heat dissipation base, and the heat dissipation base is combined with the heat dissipation plate body such as to form a chamber between the groove of the heat dissipation base and the second heat dissipation surface of the heat dissipation plate body, such that the first, second, and third fin sets are located in the chamber.

In certain embodiments, any two adjacent ones of the fins of the first fin set is spaced apart by a distance from 1.3 mm to 1.5 mm, any two adjacent ones of the fins of the second fin set is spaced apart by a distance from 1.1 mm to 1.3 mm, and any two adjacent ones of the fins of the third fin set is spaced apart by a distance from 1 mm to 1.2 mm.

In certain embodiments, a plurality of flow guiding fins are formed on the second heat dissipation surface and located in the low density heat dissipation region.

In certain embodiments, each of the fins of the first, second, and third fin sets are of equal height that is within a range from 2 mm to 10 mm.

In certain embodiments, a draft angle of each of the fins of the first, second, and third fin sets is less than 5 degrees.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
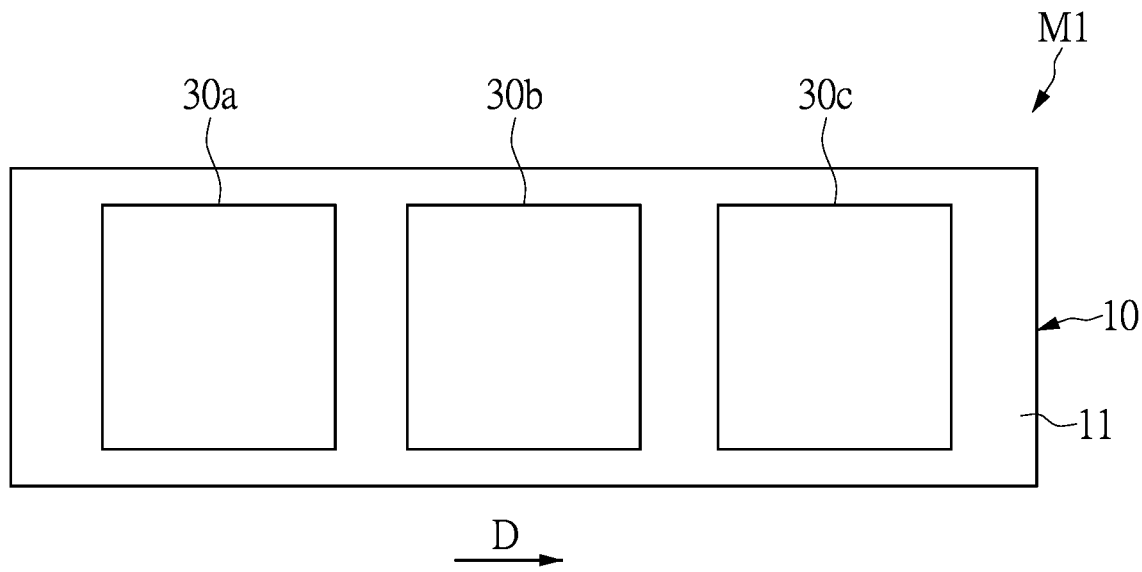
FIG. 1 is a schematic top view of a low pressure drop automotive liquid-cooling heat dissipation plate according to a first embodiment of the pre sent disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
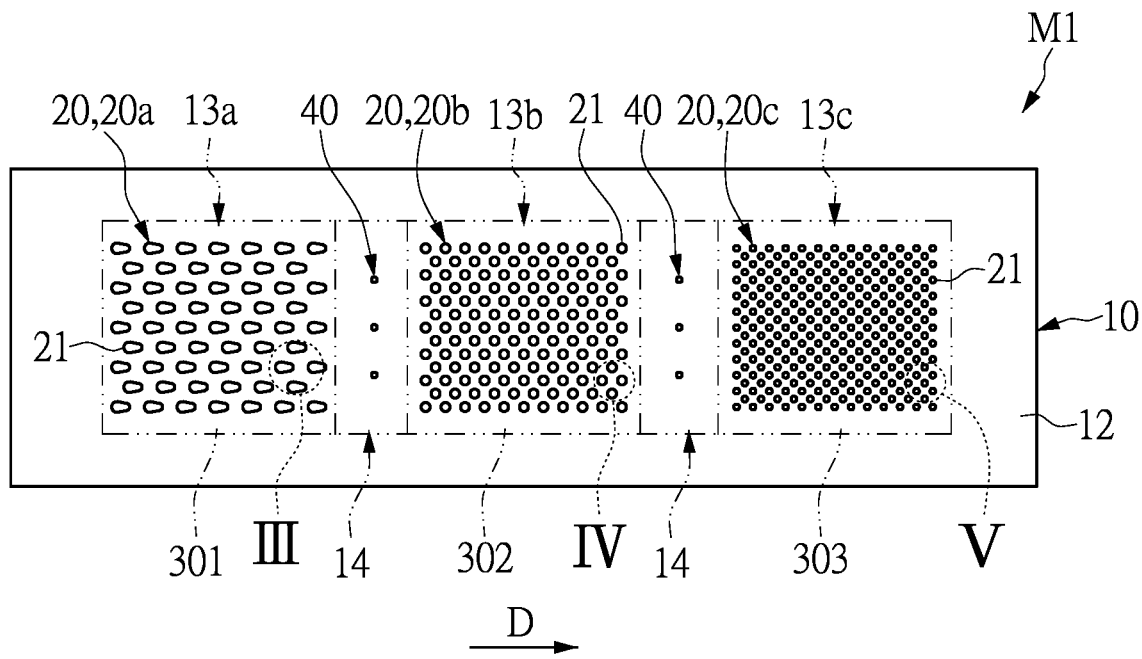
FIG. 2 is a schematic bottom view of the low pressure drop automotive liquid-cooling heat dissipation plate according to the first embodiment of the pre sent disclosure.
Figure 3:
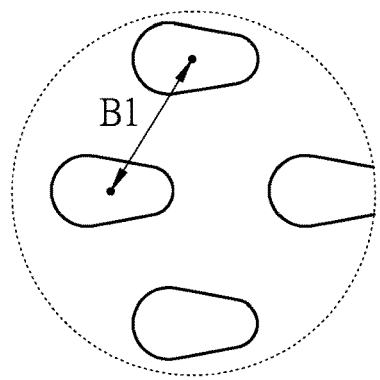
FIG. 3 is an enlarged view of part III of FIG. 2.
Figure 4:
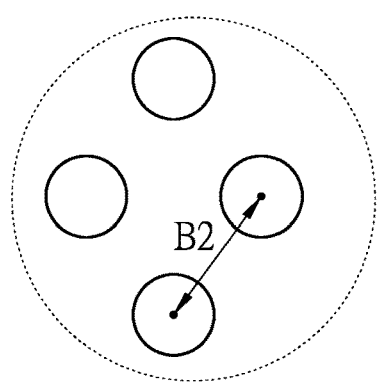
FIG. 4 is an enlarged view of part IV of FIG. 2.
Figure 5:
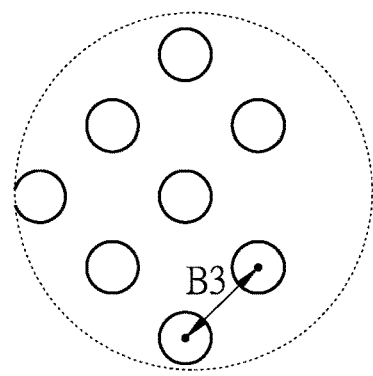
FIG. 5 is an enlarged view of part V of FIG. 2.
Figure 6:
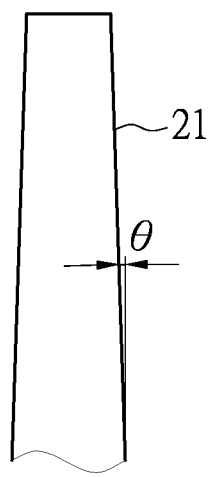
FIG. 6 is a schematic side view of a fin of the present disclosure.

Reference is made to FIG. 1 to FIG. 6, in which one embodiment of the present disclosure is shown. The first embodiment of the present disclosure provides a low pressure drop automotive liquid-cooling heat dissipation plate that is adopted in an enclosed or semi-enclosed automotive liquid-cooling cooler. As shown in FIG. 1 and FIG. 2, a low pressure drop automotive liquid-cooling heat dissipation plate M1 includes a heat dissipation plate body 10, and three fin sets 20 (a first fin set 20a, a second fin set 20b, and a third fin set 20c).

In this embodiment, the heat dissipation plate body 10 can be produced by using materials having high thermal conductivity, such as copper, copper alloy, aluminum, and aluminum alloy. The heat dissipation plate body 10 has a first heat dissipation surface 11 and a second heat dissipation surface 12 that are opposite to each other. The first heat dissipation surface 11 is in contact with a first traction inverter power component set 30a, a second traction inverter power component set 30b, and a third traction inverter power component set 30c, and the first, second, and third traction inverter power component sets 30a, 30b, and 30c together form an inverter power module for generating a three-phase alternating current for driving an automotive motor. The second heat dissipation surface 12 is in contact with a cooling fluid (e.g., water or ethylene glycol).

In this embodiment, one end of the heat dissipation plate body 10 can be located at an upstream side of the cooling fluid, and another end of the heat dissipation plate body 10 can be located at a downstream side of the cooling fluid. A first heat dissipation region 13a, a second heat dissipation region 13b, and a third heat dissipation region 13c that are spaced equidistantly from each other and that have a same size are defined on the second heat dissipation surface 12 along a flow direction D of the cooling fluid. Furthermore, the first heat dissipation region 13a is near the upstream side of the cooling fluid, the third heat dissipation region 13c is near the downstream side of the cooling fluid, and the second heat dissipation region 13b is located between the first heat dissipation region 13a and the third heat dissipation region 13c.

In this embodiment, the first, second, and third fin sets 20a, 20b, and 20c are respectively located on the first, second, and third heat dissipation regions 13a, 13b, and 13c on the second heat dissipation surface 12. The first, second, and third fin sets 20a, 20b, and 20c are preferably formed via a metal injection molding manner, so as to be integrally connected with the second heat dissipation surface 12 of the heat dissipation plate body 10, and can also be formed on the second heat dissipation surface 12 of the heat dissipation plate body 10 via forging, or connected to the second heat dissipation surface 12 of the heat dissipation plate body 10 via soldering or mounting. Furthermore, the first heat dissipation region 13a is defined by a first projection area 301 formed by projecting the first traction inverter power component set 30a on the second heat dissipation surface 12, the second heat dissipation region 13b is defined by a second projection area 302 formed by projecting the second traction inverter power component set 30b on the second heat dissipation surface 12, and the third heat dissipation region 13c is defined by a third projection area 303 formed by projecting the third traction inverter power component set 30c on the second heat dissipation surface 12.

Moreover, a surface area formed by the first fin set 20a located in the first heat dissipation region 13a and in contact with the cooling fluid is less than a surface area formed by the second fin set 20b located in the second heat dissipation region 13b and in contact with the cooling fluid, and the surface area formed by the first fin set 20a located in the first heat dissipation region 13a and in contact with the cooling fluid is less than a surface area formed by the third fin set 20c located in the third heat dissipation region 13c and in contact with the cooling fluid. In addition, any two adjacent ones of the first, second, and third heat dissipation regions 20a, 20b, and 20c have a low density heat dissipation region 14 (also called an auxiliary heat dissipation region) formed therebetween, and a low density fin set 40 is formed on the second heat dissipation surface 12 and located in the low density heat dissipation region 14. Furthermore, a surface area formed by the low density fin set 40 located in the low density heat dissipation region 14 and in contact with the cooling fluid is less than 50% of the surface area formed by the first fin set 20a located in the first heat dissipation region 13a and in contact with the cooling fluid. Accordingly, pressure drop can be minimized at both a region that is near the upstream side of the cooling fluid and a low density heat dissipation region, such that an excessive pressure drop does not occur in the overall heat dissipation plate, and an operating energy consumption of a liquid pump can be prevented from being increased. Furthermore, by the design of the low density heat dissipation region, the excessive pressure drop does not occur, and fluids having different temperatures can be mixed together, such that temperature homogeneity of the first, second and third traction inverter power component sets 30a, 30b, and 30c that are spaced apart from each other can be maintained in a process of heat dissipation.

In this embodiment, each of fins 21 of the three fin sets 20 is a pin-fin, and the fins 21 are arranged in a high density, but each of the three fin sets 20 are arranged in different densities. A density in which the fins 21 of the first fin set 20a are arranged is less than a density in which the fins 21 of the second fin set 20b are arranged, that is, the fins 21 of the first fin set 20a have a more dispersed arrangement and the fins 21 of the second fin set 20b have a more dense arrangement, such that the surface area formed by the first fin set 20a in contact with the cooling fluid is less than the surface area formed by the second fin set 20b in contact with the cooling fluid. Furthermore, the density in which the fins 21 of the second fin set 20b are arranged is less than a density in which the fins 21 of the third fin set 20c are arranged, that is, the fins 21 of the third fin set 20c have a highest arrangement density, such that the surface area formed by the second fin set 20b in contact with the cooling fluid is less than the surface area formed by the third fin set 20c in contact with the cooling fluid. In detail, the surface area formed by the first fin set 20a in contact with the cooling fluid is from 10000 mm² to 11500 mm², the surface area formed by the second fin set 20b in contact with the cooling fluid is from 11500 mm² to 13000 mm², and the surface area formed by the third fin set 20c in contact with the cooling fluid is from 13000 mm² to 14500 mm².

In addition, in order for a speed at which the cooling fluid flows through the first heat dissipation region 13a to be slowed for reducing friction, a contour of each of the fins 21 of the first fin set 20a is drop-shaped. Moreover, a contour of each of the fins of the second fin set 20b and the third fin set 20c is round-shaped, so that a speed at which the cooling fluid flows through the second heat dissipation region 13b and the third heat dissipation region 13c is faster than the speed at which the cooling fluid flows through the first heat dissipation region 13a.

Furthermore, any two adjacent ones of the fins 21 of the first fin set 20a is spaced apart by a distance B1 that is from 1.3 mm to 1.5 mm, any two adjacent ones of the fins 21 of the second fin set 20b is spaced apart by a distance B2 that is from 1.1 mm to 1.3 mm, and any two adjacent ones of the fins 21 of the third fin set 20c is spaced apart by a distance B3 that is from 1 mm to 1.2 mm. The distances B1, B2, and B3 described herein refer to a distance between centers of mass of two adjacent fins. Furthermore, each of the fins 21 of the first, second, and third fin sets 20a, 20b, and 20c are of equal height that is preferably within a range from 2 mm to 10 mm. In addition, as shown in FIG. 7, a draft angle θ of more than half of the fins 21 of the first, second, and third fin sets 20a, 20b, and 20c is required to be less than 5 degrees.

Second Embodiment

Figure 7:
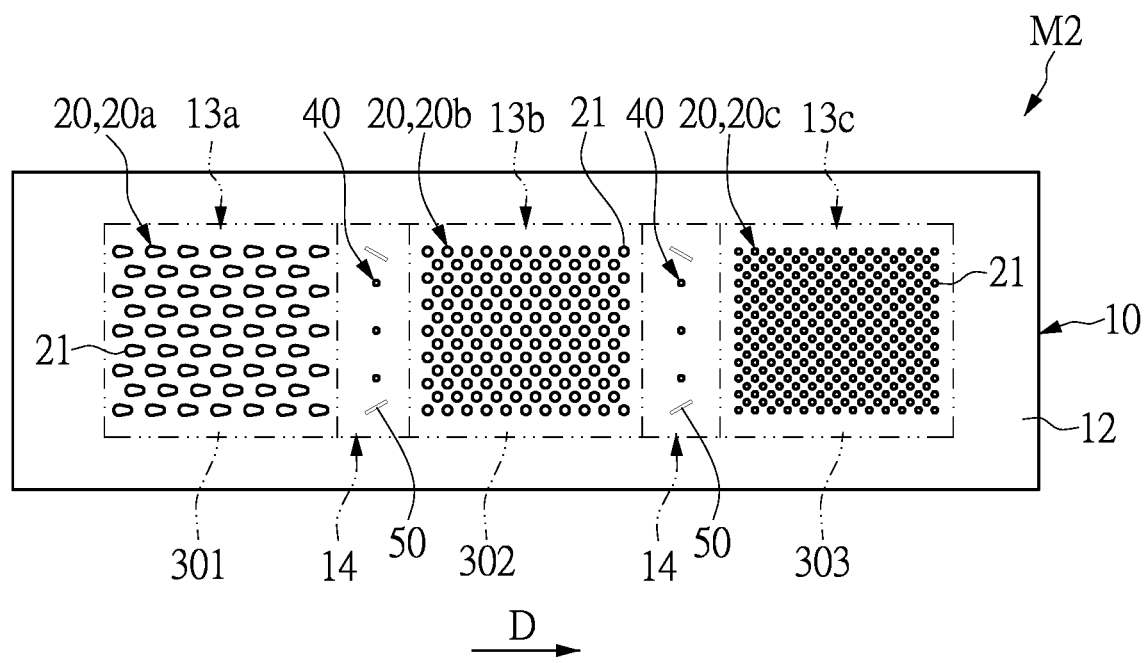
FIG. 7 is a schematic top view of a low pressure drop automotive liquid-cooling heat dissipation plate according to a second embodiment of the present disclosure.

Referring to FIG. 7, a second embodiment of the present disclosure is substantially the same as the first embodiment, and the difference therebetween is described as follows.

The present disclosure provides a low pressure drop automotive liquid-cooling heat dissipation plate M2. In this embodiment, a plurality of flow guiding fins 50 are formed on the second heat dissipation surface 12 and located in the low density heat dissipation region 14, such that a flow of the cooling fluid is improved by being guided by the flow guiding fins 50.

Third Embodiment

Figure 8:
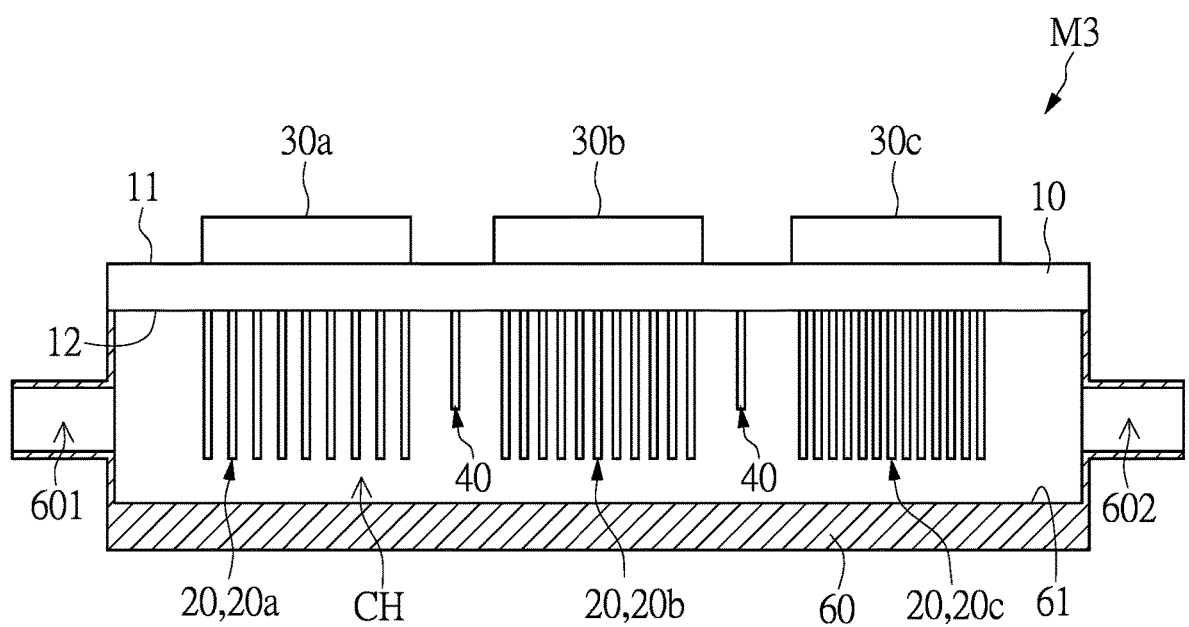
FIG. 8 is a schematic side view of an enclosed automotive liquid-cooling cooler according to a third embodiment of the present disclosure.

Referring to FIG. 8, a third embodiment of the present disclosure is substantially the same as the first embodiment, and the differences therebetween are described as follows.

The present disclosure provides an enclosed automotive liquid-cooling cooler M3. In this embodiment, the enclosed automotive liquid-cooling cooler M3 includes the low pressure drop automotive liquid-cooling heat dissipation plate described in any of the aforementioned embodiments, and further includes a heat dissipation base 60. In this embodiment, a groove 61 is recessed from the heat dissipation base 60, and the heat dissipation base 60 is combined with the heat dissipation plate body 10 such as to form a chamber CH between the groove 61 of the heat dissipation base 60 and the second heat dissipation surface 12 of the heat dissipation plate body 10, such that the first fin set 20a, the second fin set 20b, and the third fin set 20c are located in the chamber CH. Moreover, an inlet through hole 601 and an outlet through hole 602 that are respectively connected with the chamber CH are formed on the heat dissipation base 60, so that the cooling fluid can flow into the chamber CH through the inlet through hole 601 and out of the chamber CH through the outlet through hole 602 to improve a heat dissipation performance of the enclosed automotive liquid-cooling cooler M3 by forming a closed circulation loop.

Beneficial Effects of the Embodiments

In conclusion, in the low pressure drop automotive liquid-cooling heat dissipation plate, by technical features of "a low pressure drop automotive liquid-cooling heat dissipation plate including a heat dissipation plate body, a first fin set, a second fin set, and a third fin set," "the heat dissipation plate body having a first heat dissipation surface and a second heat dissipation surface that are opposite to each other, the first heat dissipation surface being in contact with a first traction inverter power component set, a second traction inverter power component set, and a third traction inverter power component set, the first, second, and third traction inverter power component sets together forming an inverter power module for generating a three-phase alternating current for driving an automotive motor, and the second heat dissipation surface being in contact with a cooling fluid," "a first heat dissipation region, a second heat dissipation region, and a third heat dissipation region that are spaced equidistantly from each other and that have a same size being defined on the second heat dissipation surface along a flow direction of the cooling fluid," "the first heat dissipation region being defined by a first projection area formed by projecting the first traction inverter power component set on the second heat dissipation surface, the second heat dissipation region being defined by a second projection area formed by projecting the second traction inverter power component set on the second heat dissipation surface, and the third heat dissipation region being defined by a third projection area formed by projecting the third traction inverter power component set on the second heat dissipation surface," "a surface area formed by the first fin set located in the first heat dissipation region and in contact with the cooling fluid being less than a surface area formed by the second fin set located in the second heat dissipation region and in contact with the cooling fluid, and the surface area formed by the first fin set located in the first heat dissipation region and in contact with the cooling fluid being less than a surface area formed by the third fin set located in the third heat dissipation region and in contact with the cooling fluid," "a contour of each of the fins of the first fin set being drop-shaped, and a contour of each of the fins of the second fin set and the third fin set being round-shaped," "any two adjacent ones of the first, second, and third heat dissipation regions having a low density heat dissipation region formed therebetween, and a low density fin set being formed on the second heat dissipation surface and located in the low density heat dissipation region," and "a surface area formed by the low density fin set located in the low density heat dissipation region and in contact with the cooling fluid being less than 50% of the surface area formed by the first fin set located in the first heat dissipation region and in contact with the cooling fluid," an excessive pressure drop does not occur in the heat dissipation plate, and an operating energy consumption of a liquid pump can be prevented from being increased. Moreover, fluids having different temperatures can be mixed together, such that temperature homogeneity of the first, second and third traction inverter power component sets that are spaced apart from each other can be maintained in a process of heat dissipation.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A low pressure drop automotive liquid-cooling heat dissipation plate, comprising:
a heat dissipation plate body having a first heat dissipation surface and a second heat dissipation surface that are opposite to each other, wherein the first heat dissipation surface is in contact with a first traction inverter power component set, a second traction inverter power component set, and a third traction inverter power component set, and the first, second, and third traction inverter power component sets together form an inverter power module for generating a three-phase alternating current for driving an automotive motor, wherein the second heat dissipation surface is in contact with a cooling fluid;
a first fin set located in a first heat dissipation region, wherein the first heat dissipation region is defined by a first projection area formed by projecting the first traction inverter power component set on the second heat dissipation surface;
a second fin set located in a second heat dissipation region, wherein the second heat dissipation region is defined by a second projection area formed by projecting the second traction inverter power component set on the second heat dissipation surface; and
a third fin set located in a third heat dissipation region, wherein the third heat dissipation region is defined by a third projection area formed by projecting the third traction inverter power component set on the second heat dissipation surface;
wherein a surface area formed by the first fin set located in the first heat dissipation region and in contact with the cooling fluid is less than a surface area formed by the second fin set located in the second heat dissipation region and in contact with the cooling fluid, and the surface area formed by the first fin set located in the first heat dissipation region and in contact with the cooling fluid is less than a surface area formed by the third fin set located in the third heat dissipation region and in contact with the cooling fluid;
wherein any two adjacent ones of the first, second, and third heat dissipation regions have a low density heat dissipation region formed therebetween, a low density fin set is formed on the second heat dissipation surface and located in the low density heat dissipation region, and a surface area formed by the low density fin set located in the low density heat dissipation region and in contact with the cooling fluid is less than 50% of the surface area formed by the first fin set located in the first heat dissipation region and in contact with the cooling fluid;
wherein a contour of each of fins of the first fin set that is located in the first heat dissipation region is drop-shaped, and a contour of each of fins of the second fin set and the third fin set that are respectively located in the second heat dissipation region and the third heat dissipation region is round-shaped;

wherein a centroid-to-centroid distance between any two adjacent ones of the fins of the first fin set that is located in the first heat dissipation region ranges from 1.3 mm to 1.5 mm, and a centroid-to-centroid distance between any two adjacent ones of the fins of the third fin set that is located in the third heat dissipation region ranges from 1.0 mm to 1.2 mm.

2. The low pressure drop automotive liquid-cooling heat dissipation plate according to claim 1, wherein a plurality of flow guiding fins are formed on the second heat dissipation surface and located in the low density heat dissipation region.

3. The low pressure drop automotive liquid-cooling heat dissipation plate according to claim 1, wherein each of the fins of the first, second, and third fin sets are of equal height that is within a range from 2 mm to 10 mm.

4. The low pressure drop automotive liquid-cooling heat dissipation plate according to claim 1, wherein a draft angle of each of the fins of the first, second, and third fin sets is less than 5 degrees.

5. An enclosed automotive liquid-cooling cooler, comprising the low pressure drop automotive liquid-cooling heat dissipation plate as claimed in claim 1 and a heat dissipation base, wherein a groove is recessed from the heat dissipation base, and the heat dissipation base is combined with the heat dissipation plate body such as to form a chamber between the groove of the heat dissipation base and the second heat dissipation surface of the heat dissipation plate body, such that the first, second, and third fin sets are located in the chamber.

* * * * *